US012685186B2

(12) United States Patent
Lugue et al.

(10) Patent No.: US 12,685,186 B2
(45) Date of Patent: Jul. 14, 2026

(54) CAVITIES IN PACKAGE CONDUCTIVE TERMINALS

(71) Applicant: TEXAS INSTRUMENTS INCORPORATED, Dallas, TX (US)

(72) Inventors: Jefferson Lugue, Baguio City (PH); ZuoHui Chen, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 454 days.

(21) Appl. No.: 18/496,598

(22) Filed: Oct. 27, 2023

(65) Prior Publication Data

US 2025/0140655 A1 May 1, 2025

(51) Int. Cl.
*H10W 70/40* (2026.01)
*H10W 70/04* (2026.01)
*H10W 74/10* (2026.01)
*H10W 90/00* (2026.01)

(52) U.S. Cl.
CPC ....... *H10W 70/429* (2026.01); *H10W 70/048* (2026.01); *H10W 74/111* (2026.01); *H10W 90/756* (2026.01)

(58) Field of Classification Search
CPC .................................................. H10W 70/429
See application file for complete search history.

(56) References Cited

U.S. PATENT DOCUMENTS

2023/0014718 A1* 1/2023 Tuncer .............. H01L 23/49503
2024/0030298 A1* 1/2024 Futamura ............ H01L 23/3135

* cited by examiner

*Primary Examiner* — Yu-Hsi D Sun
(74) *Attorney, Agent, or Firm* — Dawn Jos; Frank D. Cimino

(57) ABSTRACT

In examples, a package comprises a semiconductor die, a gullwing conductive terminal coupled to the semiconductor die, and a mold compound covering the semiconductor die and the conductive terminal. The conductive terminal extends outward from the mold compound. The conductive terminal includes a top surface and a bottom surface opposing the top surface, the conductive terminal includes a first bend and a second bend more distal from the mold compound than the first bend, and the bottom surface includes a first cavity extending along a width of the conductive terminal at the first bend. The top surface includes a second cavity extending along the width of the conductive terminal at the second bend.

18 Claims, 13 Drawing Sheets

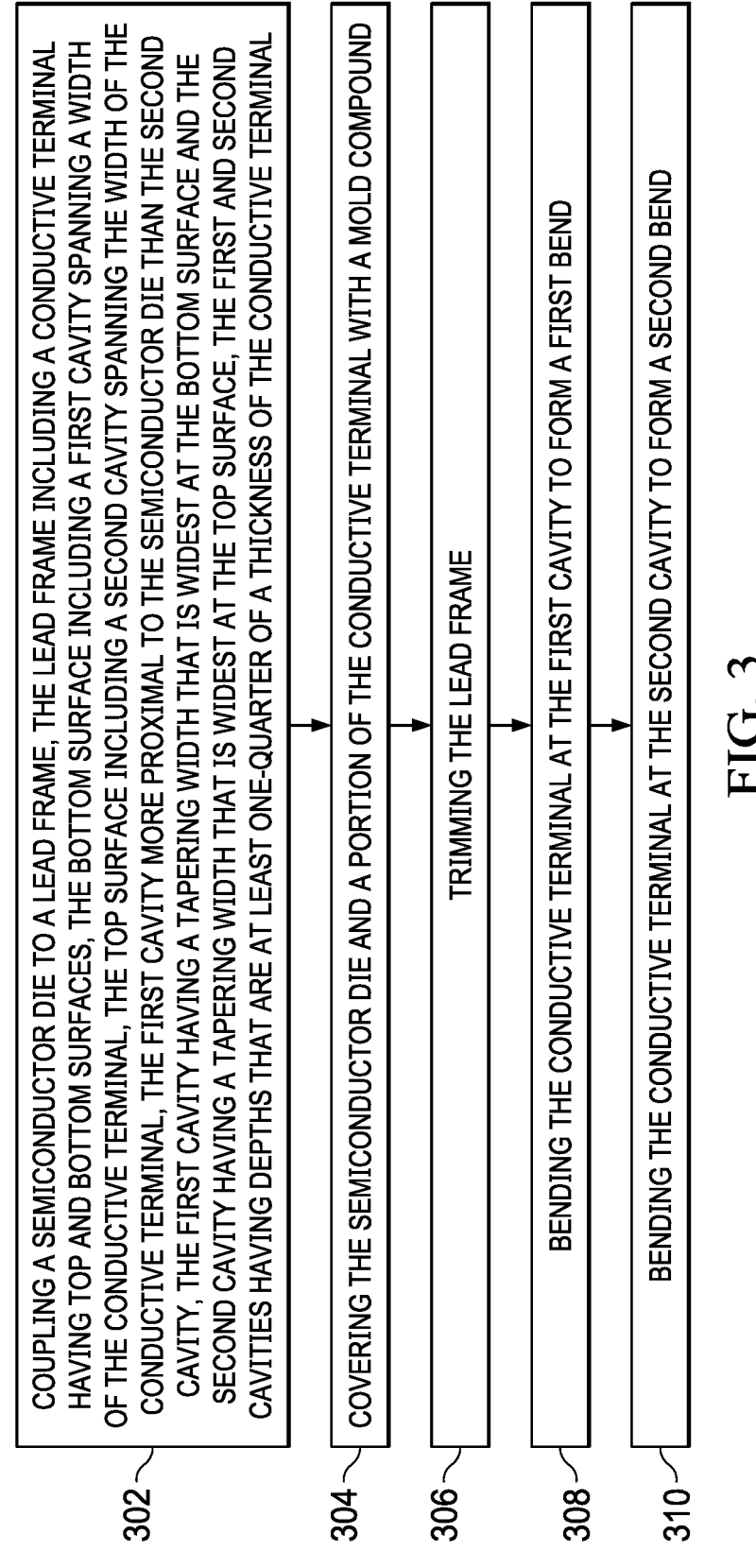

300

302 — COUPLING A SEMICONDUCTOR DIE TO A LEAD FRAME, THE LEAD FRAME INCLUDING A CONDUCTIVE TERMINAL HAVING TOP AND BOTTOM SURFACES, THE BOTTOM SURFACE INCLUDING A FIRST CAVITY SPANNING A WIDTH OF THE CONDUCTIVE TERMINAL, THE TOP SURFACE INCLUDING A SECOND CAVITY SPANNING THE WIDTH OF THE CONDUCTIVE TERMINAL, THE FIRST CAVITY MORE PROXIMAL TO THE SEMICONDUCTOR DIE THAN THE SECOND CAVITY, THE FIRST CAVITY HAVING A TAPERING WIDTH THAT IS WIDEST AT THE BOTTOM SURFACE AND THE SECOND CAVITY HAVING A TAPERING WIDTH THAT IS WIDEST AT THE TOP SURFACE, THE FIRST AND SECOND CAVITIES HAVING DEPTHS THAT ARE AT LEAST ONE-QUARTER OF A THICKNESS OF THE CONDUCTIVE TERMINAL

304 — COVERING THE SEMICONDUCTOR DIE AND A PORTION OF THE CONDUCTIVE TERMINAL WITH A MOLD COMPOUND

306 — TRIMMING THE LEAD FRAME

308 — BENDING THE CONDUCTIVE TERMINAL AT THE FIRST CAVITY TO FORM A FIRST BEND

310 — BENDING THE CONDUCTIVE TERMINAL AT THE SECOND CAVITY TO FORM A SECOND BEND

CAVITIES IN PACKAGE CONDUCTIVE TERMINALS

BACKGROUND

Semiconductor wafers are circular pieces of semiconductor material, such as silicon, that are used to manufacture semiconductor chips. Generally, complex manufacturing processes are used to form numerous integrated circuits on a single wafer. The formation of such circuits on a wafer is called fabrication. After wafer fabrication, the wafer is cut into multiple pieces, called semiconductor dies, with each semiconductor die containing one of the circuits. The cutting, or sawing, of the wafer into individual dies is called singulation. Dies are then coupled to a lead frame and are covered by a mold compound, which is subsequently sawn to produce a package.

SUMMARY

In examples, a package comprises a semiconductor die, a gullwing conductive terminal coupled to the semiconductor die, and a mold compound covering the semiconductor die and the conductive terminal. The conductive terminal extends outward from the mold compound. The conductive terminal includes a top surface and a bottom surface opposing the top surface, the conductive terminal includes a first bend and a second bend more distal from the mold compound than the first bend, and the bottom surface includes a first cavity extending along a width of the conductive terminal at the first bend. The top surface includes a second cavity extending along the width of the conductive terminal at the second bend.

In examples, a method for manufacturing a package comprises coupling a semiconductor die to a lead frame. The lead frame includes a conductive terminal having top and bottom surfaces, with the bottom surface including a first cavity spanning a width of the conductive terminal, the top surface including a second cavity spanning the width of the conductive terminal, and the first cavity more proximal to the semiconductor die than the second cavity. The first cavity has a tapering width that is widest at the bottom surface and the second cavity has a tapering width that is widest at the top surface. The first and second cavities have depths that are at least one-quarter of a thickness of the conductive terminal. The method also comprises covering the semiconductor die and a portion of the conductive terminal with a mold compound; trimming the lead frame; bending the conductive terminal at the first cavity to form a first bend; and bending the conductive terminal at the second cavity to form a second bend.

BRIEF DESCRIPTION OF THE DRAWINGS

FIG. 3 is a flow diagram of a method for manufacturing a package having conductive terminal cavities in accordance with various examples.

FIG. 4A-4D are a process flow for manufacturing a package having conductive terminal cavities in accordance with various examples.

DETAILED DESCRIPTION

Package conductive terminals, also referred to herein as package leads, extend from a mold compound covering a semiconductor die. During manufacture, a conductive terminal may be bent using a form punch, for example, to form a gullwing conductive terminal. Bending the conductive terminal imparts stresses to the conductive terminal, in particular at the junction between the conductive terminal and the mold compound. Such stresses can cause crevices to form at the junction. The crevices are disadvantageous because they expose the contents of the package to ambient conditions, which can damage the package. Crevices can also result in weak solder joints where the conductive terminal is coupled to a printed circuit board (PCB). Further, bending can be difficult, particularly with thick conductive terminals. Inadequate bending can result in large foot angles, which, in turn, results in poor solder wettability and solder joint stability. These technical problems pose significant challenges to the structural and functional integrity of the packages.

This disclosure describes various examples of a package that mitigates the technical challenges described above. The package includes cavities in the package conductive terminals that facilitate bending and mitigate stress, thereby mitigating the incidence and/or severity of crevices and reducing or eliminating conductive terminal foot angles. In examples, a package comprises a semiconductor die, a gullwing conductive terminal coupled to the semiconductor die, and a mold compound covering the semiconductor die and the conductive terminal. The conductive terminal extends outward from the mold compound. The conductive terminal includes a top surface and a bottom surface opposing the top surface. The conductive terminal includes a first bend and a second bend more distal from the mold compound than the first bend. The bottom surface includes a first cavity extending along a width of the conductive terminal at the first bend. The top surface includes a second cavity extending along the width of the conductive terminal at the second bend.

Figure 1A:
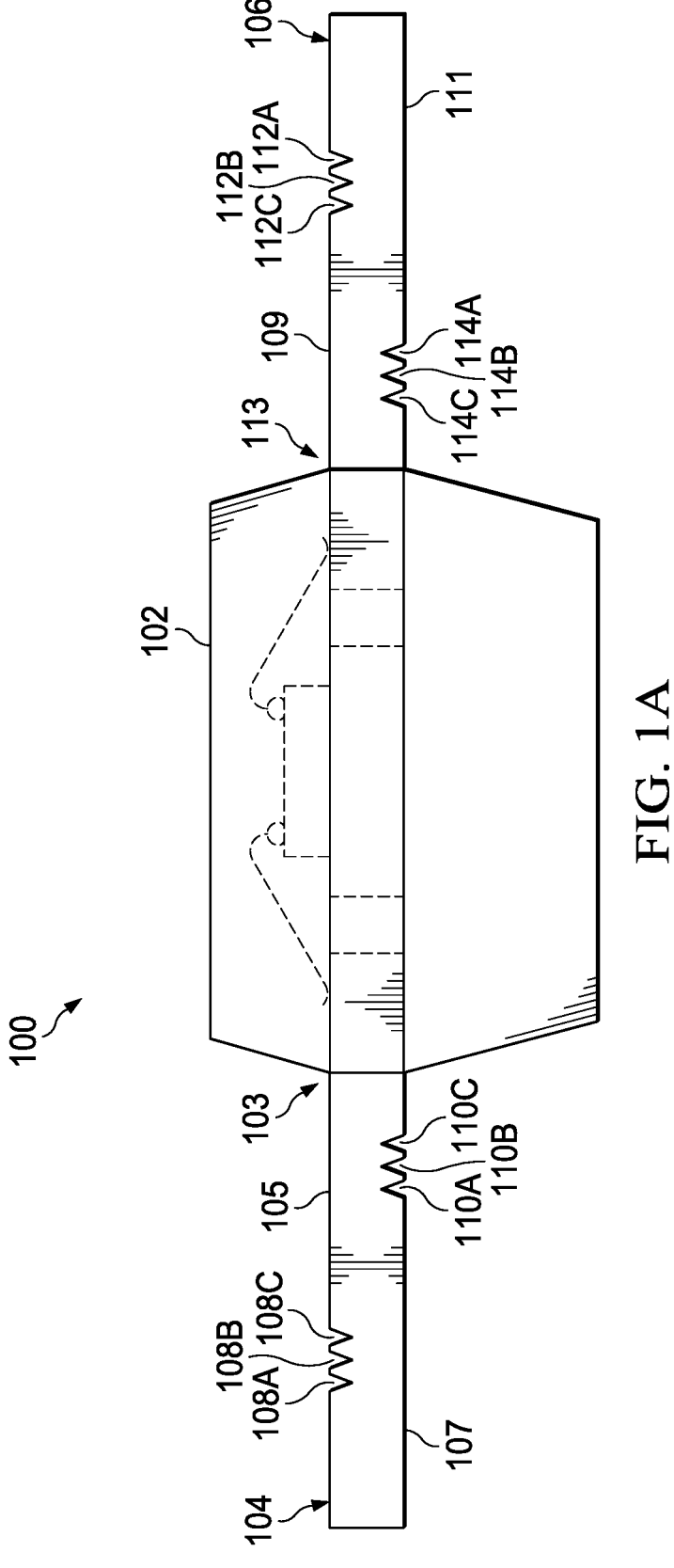
FIG. 1A is a profile view of a package having conductive terminal cavities in accordance with various examples.
Figure 1B:
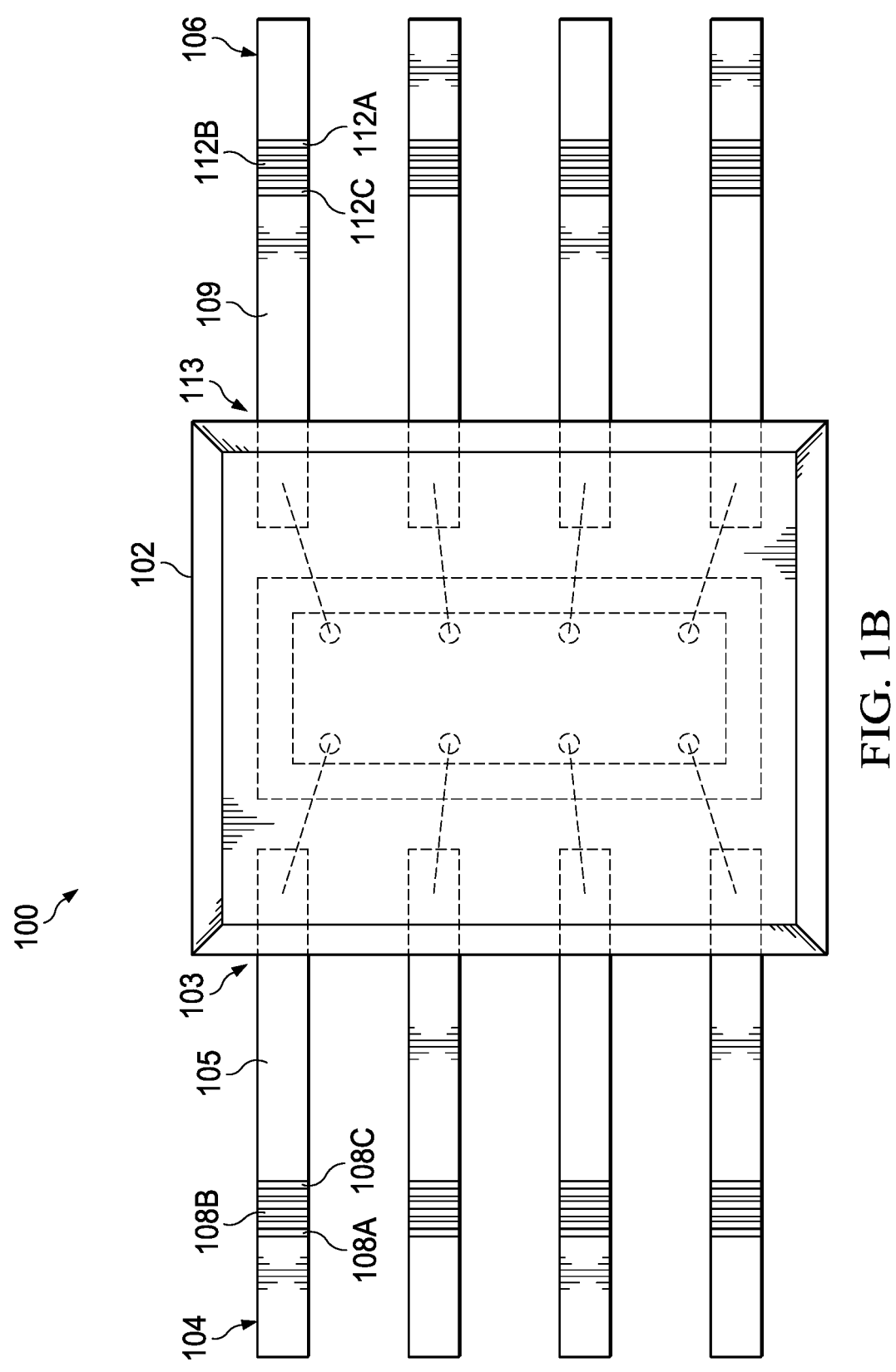
FIG. 1B is a top-down view of a package having conductive terminal cavities in accordance with various examples.
Figure 1C:
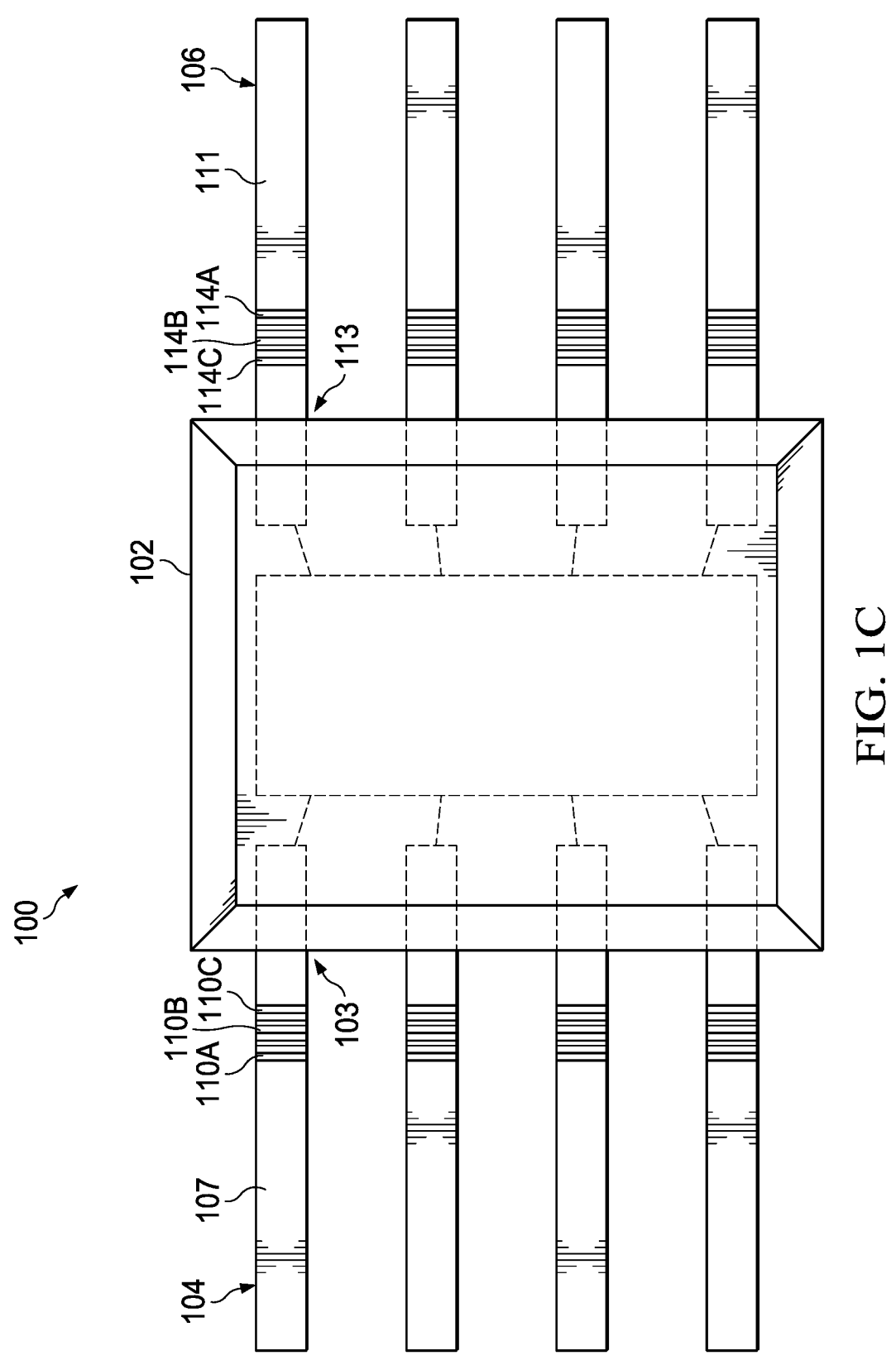
FIG. 1C is a bottom-up view of a package having conductive terminal cavities in accordance with various examples.
Figure 1D:
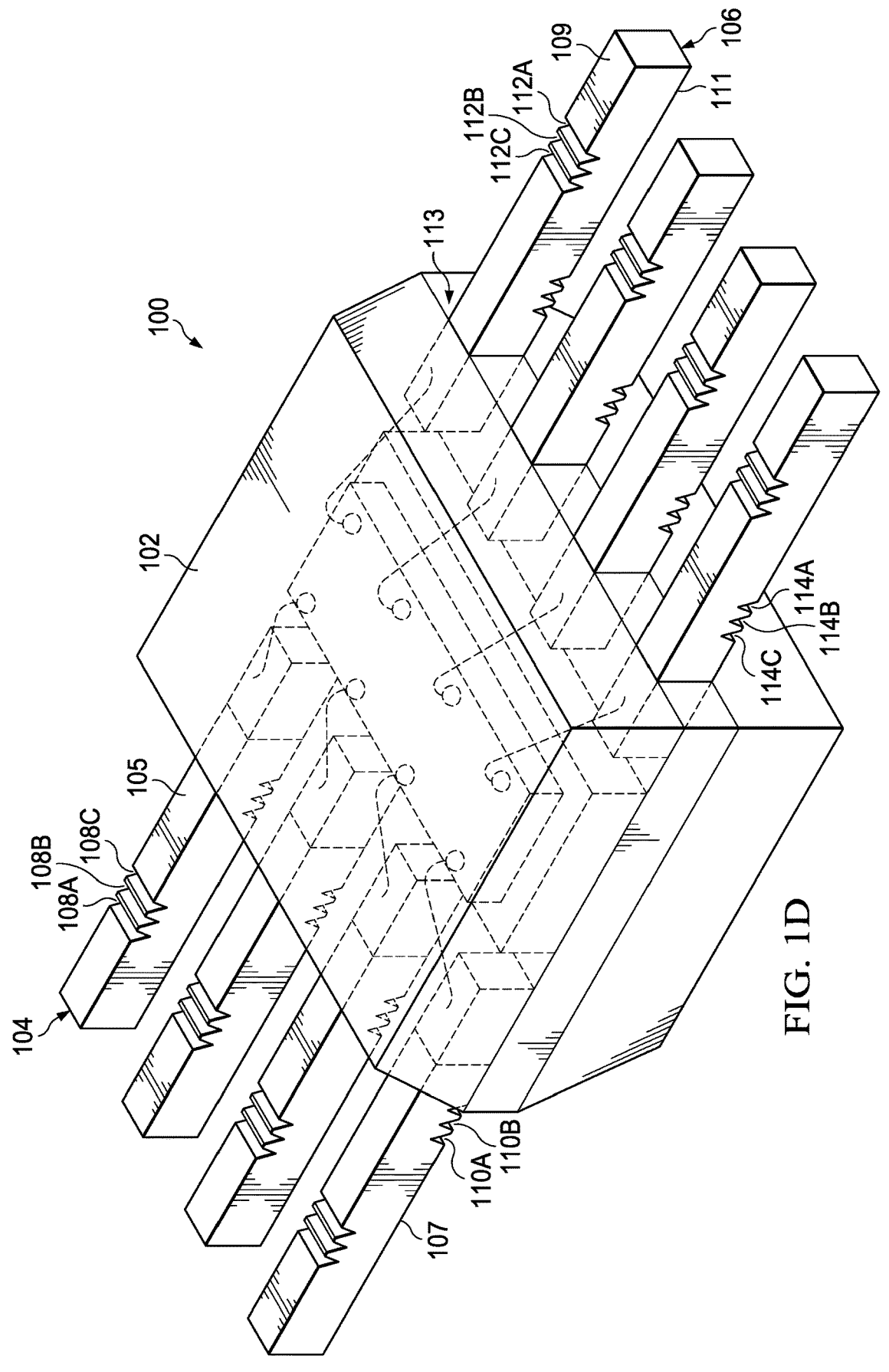
FIG. 1D is a perspective view of a package having conductive terminal cavities in accordance with various examples.

FIG. 1A is a profile view of a package having conductive terminal cavities in accordance with various examples. Specifically, FIG. 1A shows a package 100 including a package body 102 that includes a mold compound covering various structures, such as a semiconductor die, portions of conductive terminals (e.g., package leads/pins), bond wires, solder bumps, etc.). A conductive terminal 104 (e.g., package lead or pin) extends from one or more lateral surfaces of the package 100. In examples, the conductive terminal 104 is a gullwing terminal. A conductive terminal 106 (e.g., package lead or pin) extends from one or more lateral surfaces of the package 100. In examples, the conductive terminal 106 is a gullwing terminal. Although the view of FIG. 1A only shows two conductive terminals 104, 106, the package 100 may include additional such conductive terminals, as is shown in FIGS. 1B-1D, for example. The descriptions provided herein of one or both of the conductive terminals 104, 106 may also apply to other conductive terminals of the package 100.

The conductive terminal 104 includes a top surface 105 and a bottom surface 107. The top surface 105 has multiple cavities 108A, 108B, and 108C (collectively referred to as cavities 108) formed therein.

Each of the cavities 108 may have similar or identical physical dimensions. The cavity 108A has a triangular cross-sectional shape, meaning that the width of the cavity 108A tapers from its greatest width closest to the top surface 105 and its smallest width farthest from the top surface 105. A triangular cross-sectional shape is critical because it facilitates bending of the conductive terminal 104, as described below. The cavity 108A has a depth (as measured from the top surface 105 toward the bottom surface 107) that is at least one-fourth of the thickness of the conductive terminal 104 as measured from the top surface 105 to the bottom surface 107. A depth of the cavity 108A less than one-fourth the thickness of the conductive terminal 104 is disadvantageous because it will not adequately mitigate the deleterious stresses described above, and thus will not adequately mitigate the formation of crevices and large foot angles. Notwithstanding the three cavities 108 shown in FIG. 1A, the number of cavities 108 ranges from 2 to 3, with fewer cavities than this range being disadvantageous because they will not adequately mitigate the deleterious stresses described herein, and with more cavities than this range being disadvantageous because it will cause lead pulling and negatively impact the mechanical integrity of the package. The cavities 108 are positioned within a specific distance range from a point 103 at which the conductive terminal 104 emerges from the mold compound of the package body 102. This distance ranges from 0.541 mm to 0.777 mm as measured from the point 103 along the length of the top surface 105 of the conductive terminal 104. A distance less than this range is disadvantageous because it results in unacceptably large foot angles, and a distance above this range is disadvantageous because it also results in acceptably large foot angles.

The bottom surface 107 includes cavities 110A, 110B, and 110C (collectively referred to herein as cavities 110). The cavities 110 have the same physical features and dimensions as the cavities 108, including shape, width, depth, length, pitch, quantity, etc. These features and dimensions of the cavities 110 are critical, just as the features and dimensions of the cavities 108 (described above) are critical. However, the cavities 110 differ from the cavities 108 in their location. Specifically, the cavities 110 are positioned within a specific distance range from the point 103 at which the conductive terminal 104 emerges from the mold compound of the package body 102. This distance is at least 0.08 mm as measured from the point 103 along the length of the bottom surface 107 of the conductive terminal 104. A distance less than this range is disadvantageous because it results in the formation of crevices due to lead pulling caused by high bend forces during lead bending.

The conductive terminal 106 emerges from a lateral surface(s) of the mold compound of the package body 102. The conductive terminal 106 includes a top surface 109 and a bottom surface 111. The top surface 109 includes cavities 112A, 112B, and 112C (collectively referred to herein as cavities 112). The cavities 112 have the same physical features and dimensions as the cavities 108, including shape, width, depth, length, pitch, quantity, etc. These features and dimensions of the cavities 112 are critical, just as the features and dimensions of the cavities 108 (described above) are critical. The cavities 112 are positioned within a specific distance range from a point 113 at which the conductive terminal 106 emerges from the mold compound of the package body 102. This distance ranges from 0.541 mm to 0.777 mm as measured from the point 113 along the length of the top surface 109 of the conductive terminal 106. A distance less than this range is disadvantageous because it results in unacceptably large foot angles, and a distance greater than this range is disadvantageous because it also results in unacceptably large foot angles.

The bottom surface 111 includes cavities 114A, 114B, and 114C (collectively referred to herein as cavities 114). The cavities 114 have the same physical features and dimensions as the cavities 108, including shape, width, depth, length, pitch, quantity, etc. These features and dimensions of the cavities 114 are critical, just as the features and dimensions of the cavities 108 (described above) are critical. The cavities 114 are positioned within a specific distance range from the point 113 at which the conductive terminal 106 emerges from the mold compound of the package body 102. This distance is at least 0.08 mm as measured from the point 113 along the length of the bottom surface 111 of the conductive terminal 106. A distance less than this range is disadvantageous because it results in crevice formation due to lead pulling.

FIG. 1B is a top-down view of the package 100 having conductive terminal cavities in accordance with various examples. FIG. 1C is a bottom-up view of the package 100 having conductive terminal cavities in accordance with various examples. FIG. 1D is a perspective view of the package 100 having conductive terminal cavities in accordance with various examples. As FIGS. 1B-1D show, the package 100 may include additional conductive terminals. Other conductive terminals of the package 100 have cavities on top and bottom surfaces. The cavities have the same physical features and dimensions as the cavities 108, including shape, width, depth, length, pitch, quantity, etc. These features and dimensions of the cavities are critical, just as the features and dimensions of the cavities 108 (described above) are critical. The positions of these cavities are within the same distance ranges as those provided above for the cavities 108, 110, 112, and 114, depending on whether the cavities are on top surfaces of conductive terminals or bottom surfaces of conductive terminals.

As FIGS. 1B-1D show, each of the cavities 108 has a length that extends across the full width of the conductive terminal 104. Failure of a cavity to extend across the full width of the conductive terminal 104 can result in asymmetrical bending, unacceptable foot angles, difficulty in solder wetting, and other challenges to the structural and functional integrity of the package 100.

Figure 2A:
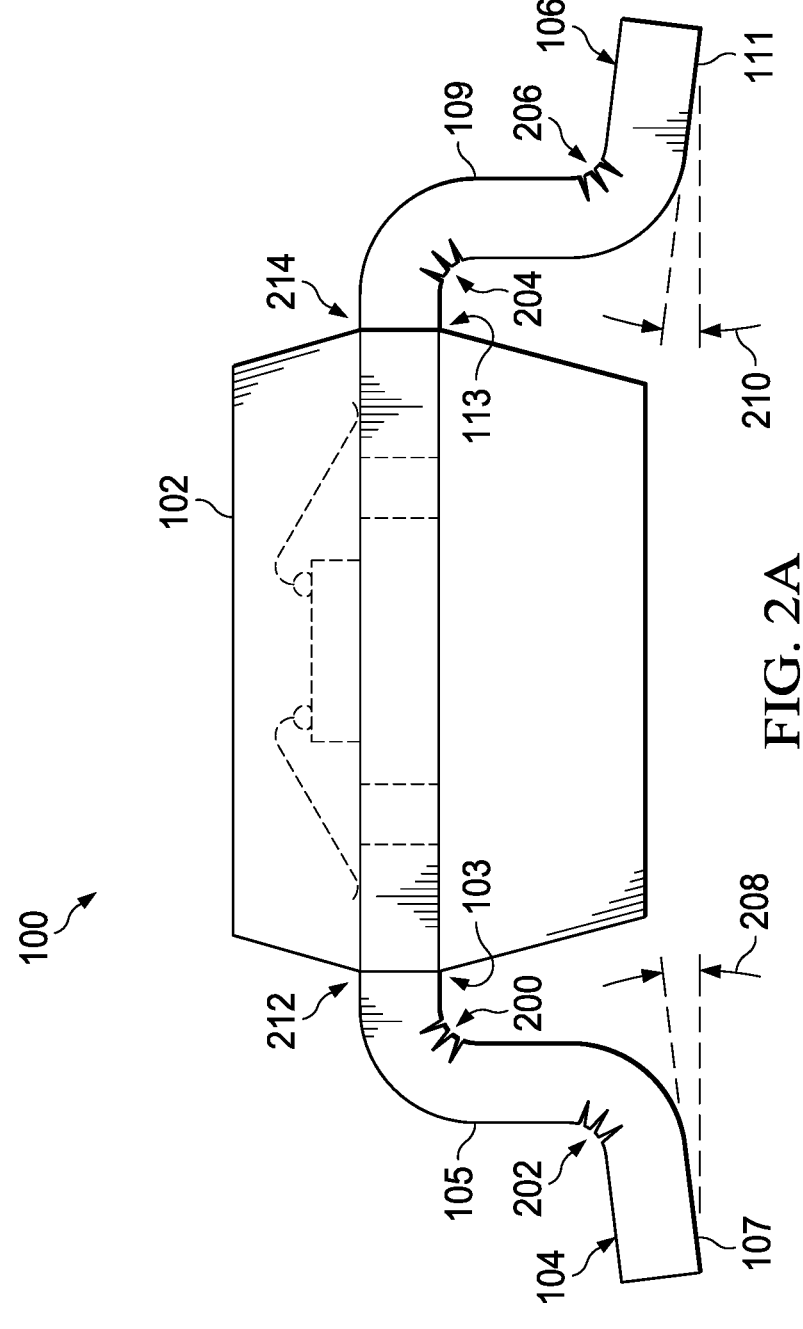
FIG. 2A is a profile view of a package having conductive terminal cavities in accordance with various examples.

During manufacture, the conductive terminals 104, 106 of the package 100 are bent to form a specific shape, such as a gullwing. In accordance with examples, the conductive terminal 104 is bent at the location of the cavities 110 to form a concavity along the bottom surface 107, where the concavity includes the cavities 110. As used herein, a concavity is a concave surface. Similarly, the conductive terminal 104 is bent at the location of the cavities 108 to form a concavity along the top surface 105, where the concavity includes the cavities 108. Likewise, the conductive terminal 106 is bent at the location of the cavities 114 to form a concavity along the bottom surface 111, where the concavity includes the cavities 114. Similarly, the conductive terminal 106 is bent at the location of the cavities 112 to form a concavity along the top surface 109, where the concavity includes the cavities 112. FIG. 2A is a profile view of the package 100 having conductive terminal cavities in accordance with various examples. More specifically, FIG. 2A shows the package 100 of FIGS. 1A-1D, with the conductive terminals 104, 106 having been bent as described above. The conductive terminal 104 includes a concavity 200 at which the cavities 110 are located. The conductive terminal 104 includes a concavity 202 at which the cavities 108 are located. The conductive terminal 106 includes a concavity 204 at which the cavities 114 are located. The conductive terminal 106 includes a concavity 206 at which the cavities 112 are located.

As shown in FIG. 2A, the conductive terminal 104 has a foot angle 208 ranging between 0 degrees and 8 degrees, with a foot angle 208 lower than this range being disadvantageous because the heel height would be less than the solder thickness, and with a foot angle 208 above this range being disadvantageous because the solder fillet would exhibit a positive wetting angle, wet all elements of the connection, and extend to the edge of the bond pad. A foot angle indicates the degree to which a most distal segment of a conductive terminal (relative to the package body) is bent. If the bottom surface of this most distal segment is parallel to the bottom surface of the package body, the foot angle is approximately zero.

The conductive terminal 106 has a foot angle 210 ranging between 0 degrees and 8 degrees, with a foot angle 210 lower than this range being disadvantageous because the heel height would be less than the solder thickness, and with a foot angle 210 above this range being disadvantageous because the solder fillet would exhibit a positive wetting angle, wet all elements of the connection, and extend to the edge of the bond pad. These foot angles 208, 210 are smaller than they would otherwise be because the cavities facilitate adequate bending of the conductive terminals 104, 106. In addition, no crevices are present at the points 103, 113, 212, or 214, because the stresses in the conductive terminals 104, 106 during bending are minimized by the presence of the cavities of the conductive terminals 104, 106.

Figure 2B:
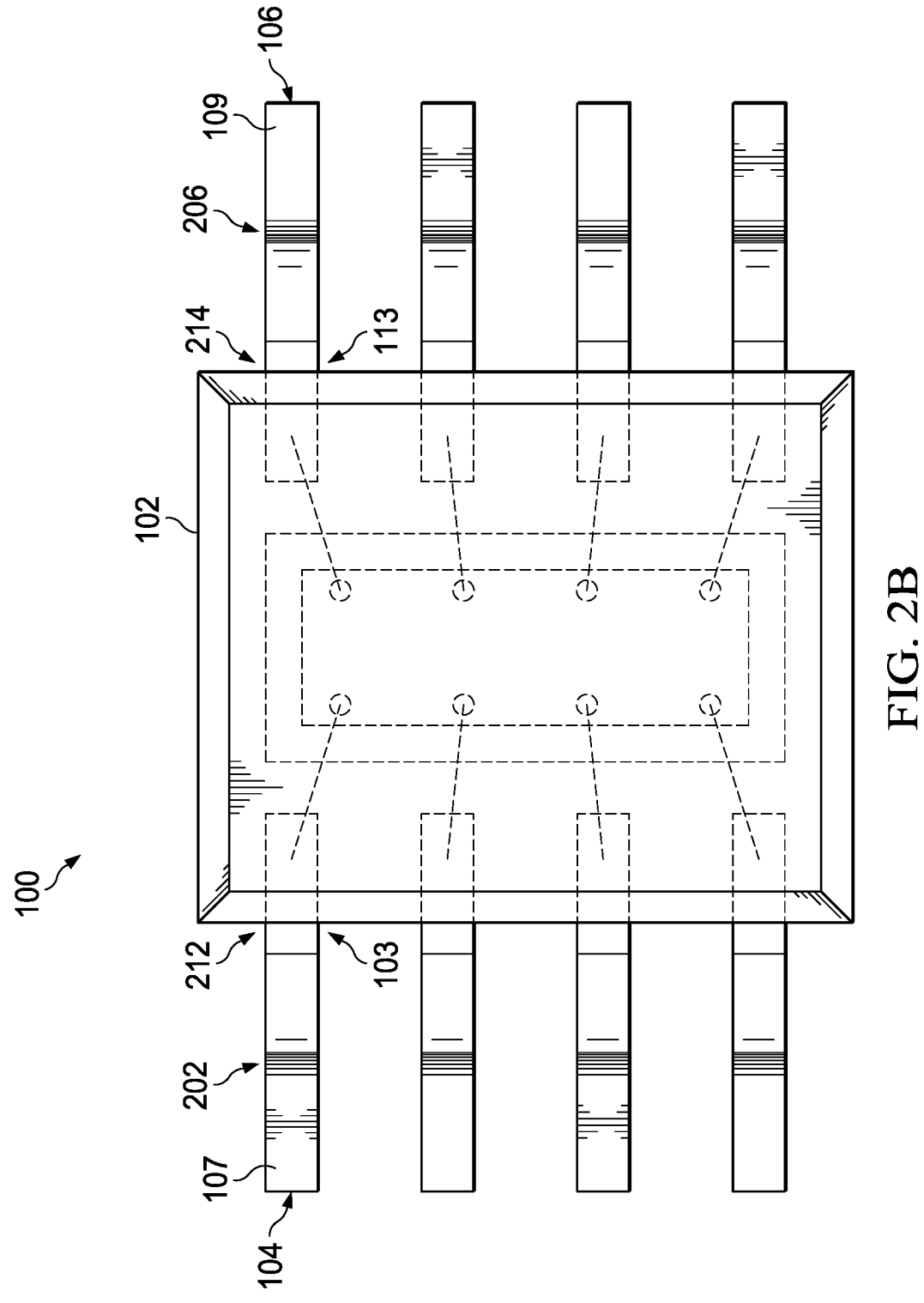
FIG. 2B is a top-down view of a package having conductive terminal cavities in accordance with various examples.
Figure 2C:
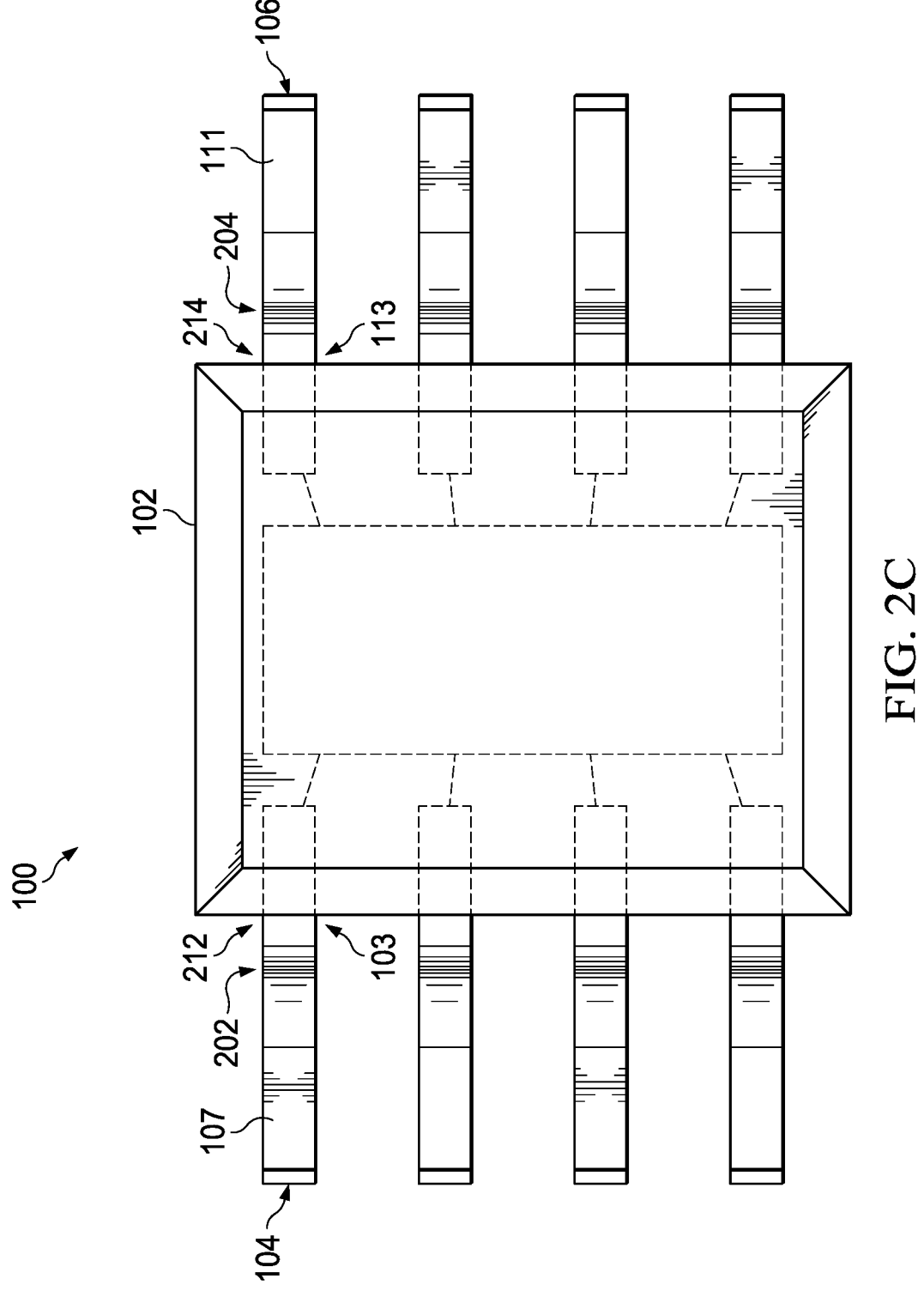
FIG. 2C is a bottom-up view of a package having conductive terminal cavities in accordance with various examples.
Figure 2D:
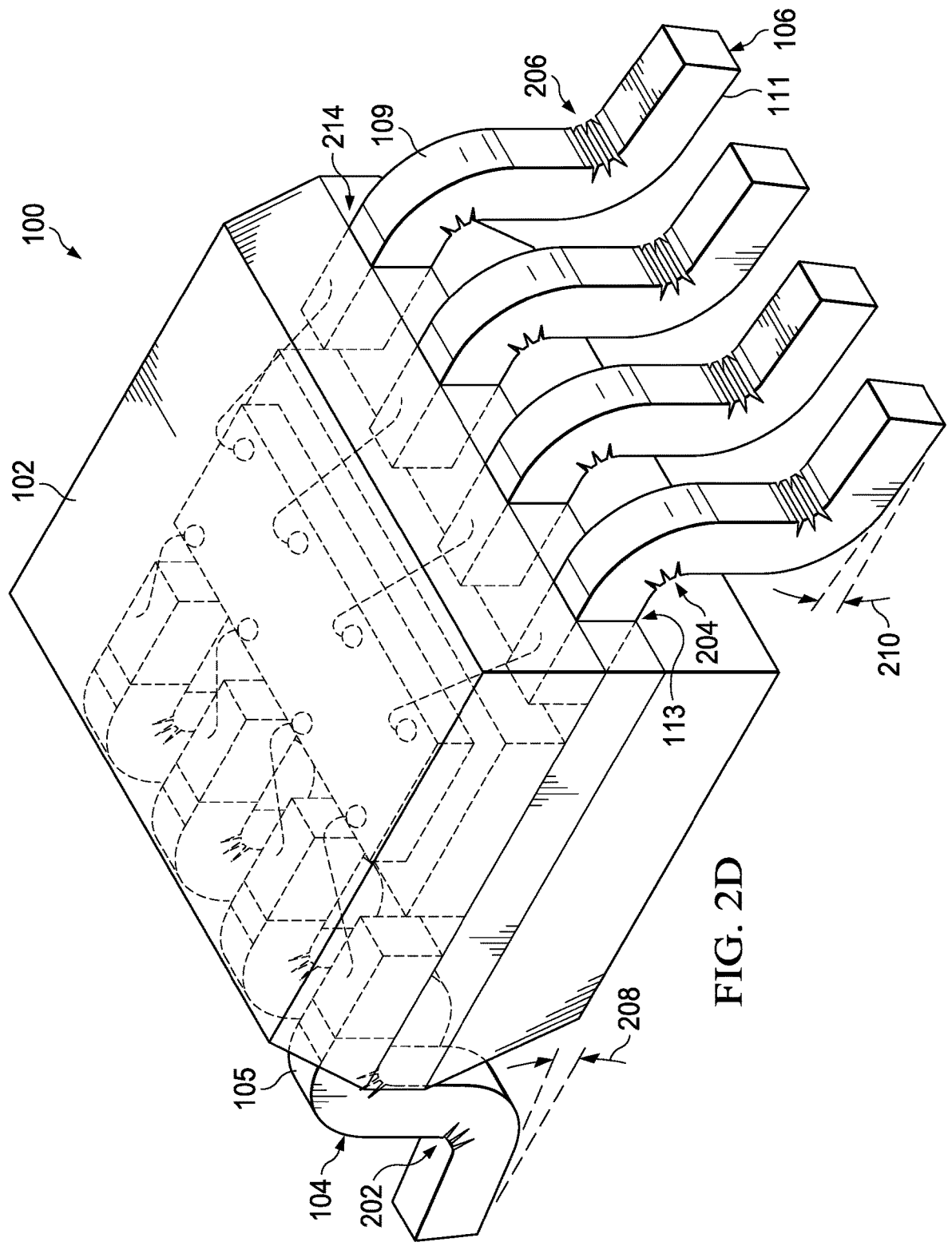
FIG. 2D is a perspective view of a package having conductive terminal cavities in accordance with various examples.

FIG. 2B is a top-down view of the package 100 having conductive terminal cavities in accordance with various examples. FIG. 2C is a bottom-up view of the package 100 having conductive terminal cavities in accordance with various examples. FIG. 2D is a perspective view of the package 100 having conductive terminal cavities in accordance with various examples.

FIG. 3 is a flow diagram of a method 300 for manufacturing the package 100 having conductive terminal cavities in accordance with various examples. FIG. 4A-4D are a process flow for manufacturing the package 100 having conductive terminal cavities in accordance with various examples. Accordingly, FIGS. 3 and 4A-4D are now described in parallel.

The method 300 includes coupling a semiconductor die to a lead frame (302). The lead frame includes a conductive terminal having top and bottom surfaces (302). The bottom surface includes a first cavity spanning a width of the conductive terminal (302). The top surface includes a second cavity spanning the width of the conductive terminal (302). The first cavity is more proximal to the semiconductor die than the second cavity (302). The first cavity has a tapering width that is widest at the bottom surface and the second cavity has a tapering width that is widest at the top surface (302). The first and second cavities have depths that are at least one-quarter of a thickness of the conductive terminal (302).

Figure 4A:
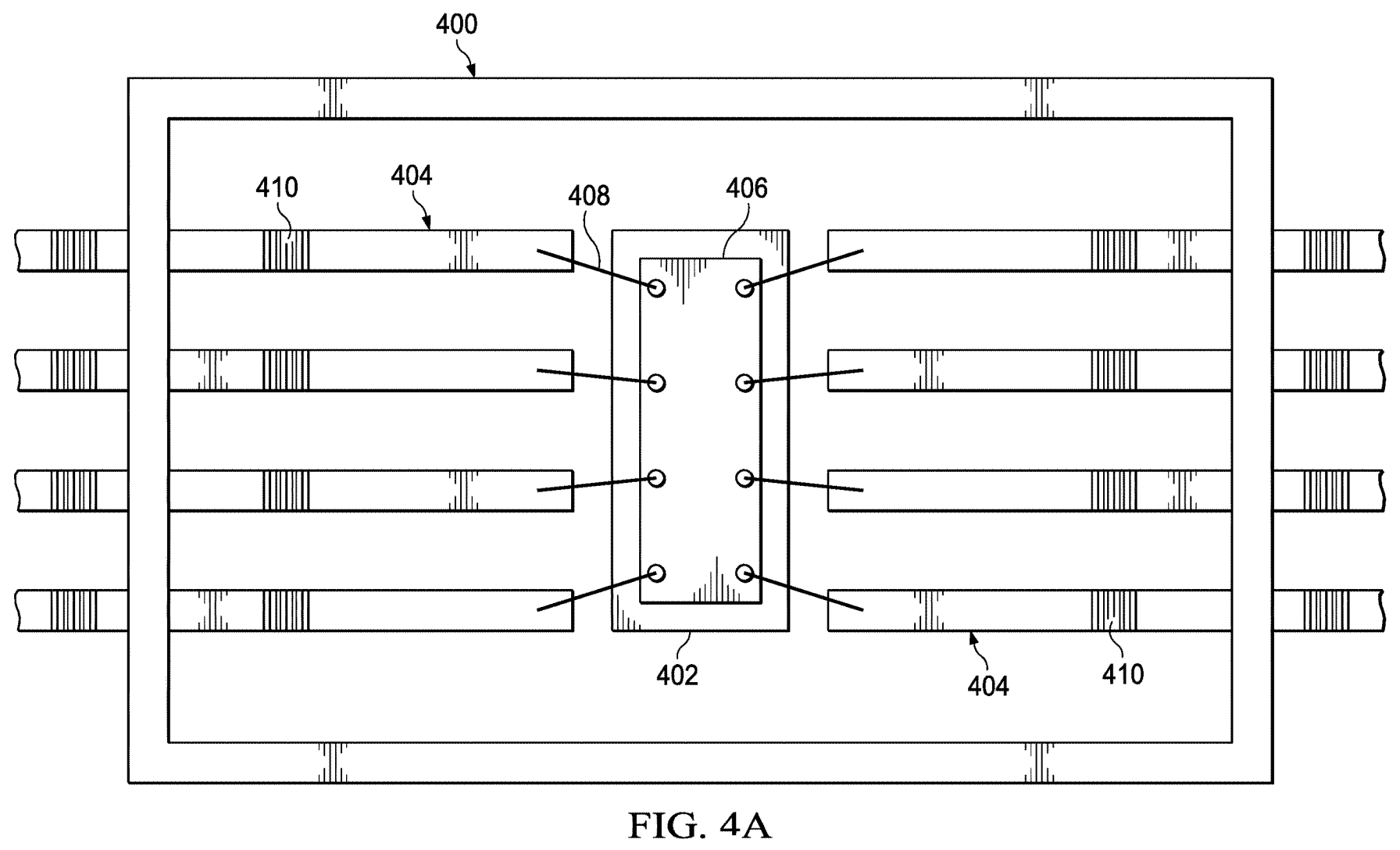

FIG. 4A shows a top-down view of a lead frame 400 including a die pad 402 and conductive terminals 404. The conductive terminals 404 may include, for example, conductive terminals 104 and 106, described above. A semiconductor die 406 is coupled to the die pad 402. Bond wires 408 couple the semiconductor die 406 to the conductive terminals 404. In some examples, bond wires 408 are omitted and the semiconductor die 406 is coupled to the conductive terminals 404 using a flip-chip configuration in which a device side of the semiconductor die 406 faces downward and solder bumps are used to couple the semiconductor die 406 to the conductive terminals 404. As shown, top surfaces of the conductive terminals 404 include cavities 410. Cavities 410 included on bottom surfaces of the conductive terminals 404 are not visible in the view of FIG. 4A. The cavities 410 have the same physical features and dimensions as the cavities 108, including shape, width, depth, length, pitch, quantity, etc. These features and dimensions of the cavities 410 are critical, just as the features and dimensions of the cavities 108 (described above) are critical. The cavities 410 may be formed by a stamping tool during the lead frame manufacturing process.

Figure 4B:
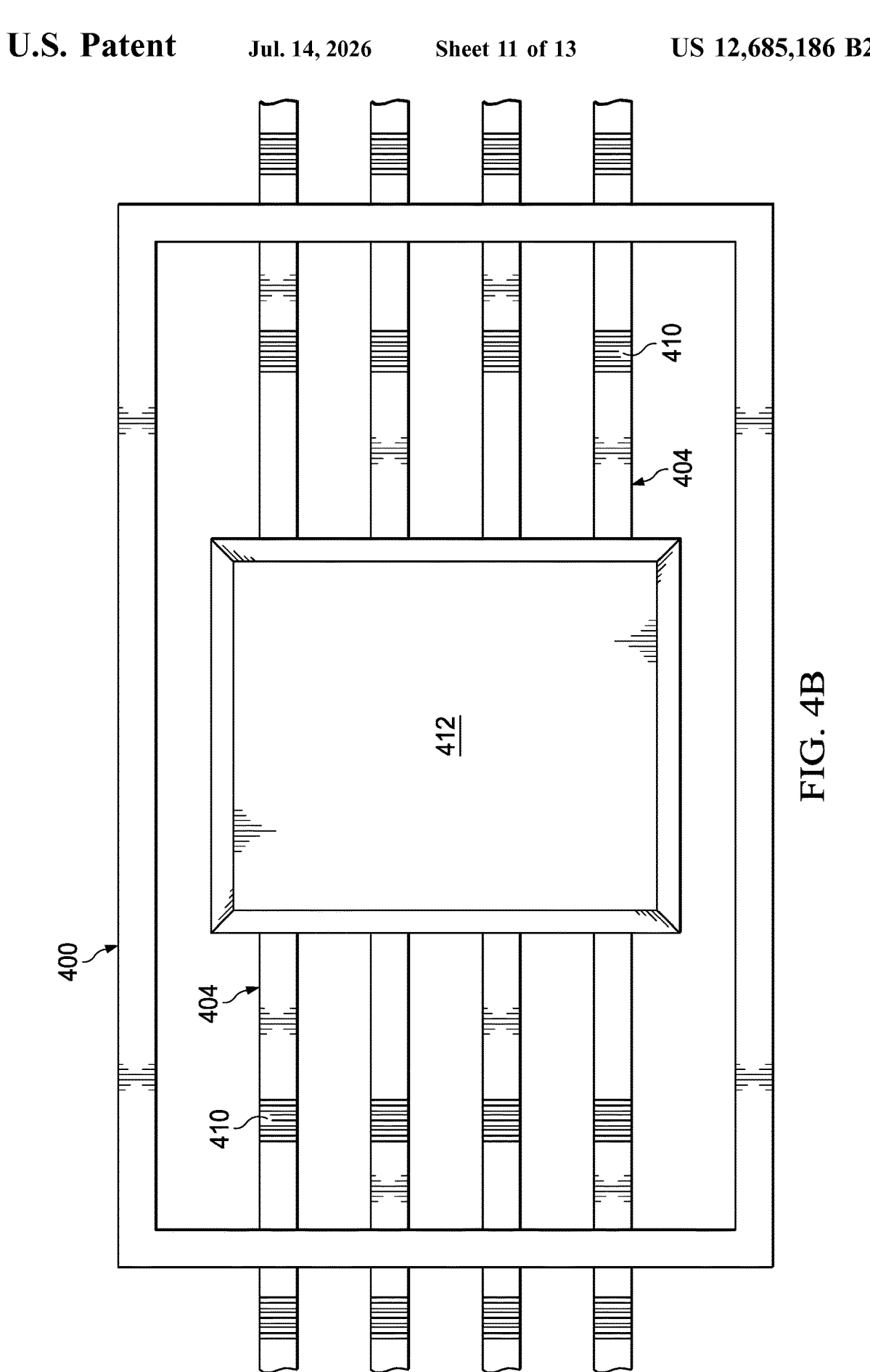

The method 300 includes covering the semiconductor die and a portion of the conductive terminal with a mold compound (304). FIG. 4B shows a mold compound 412 applied to the die pad 402, semiconductor die 406, and bond wires 408, as well as portions of the conductive terminals 404.

Figure 4C:
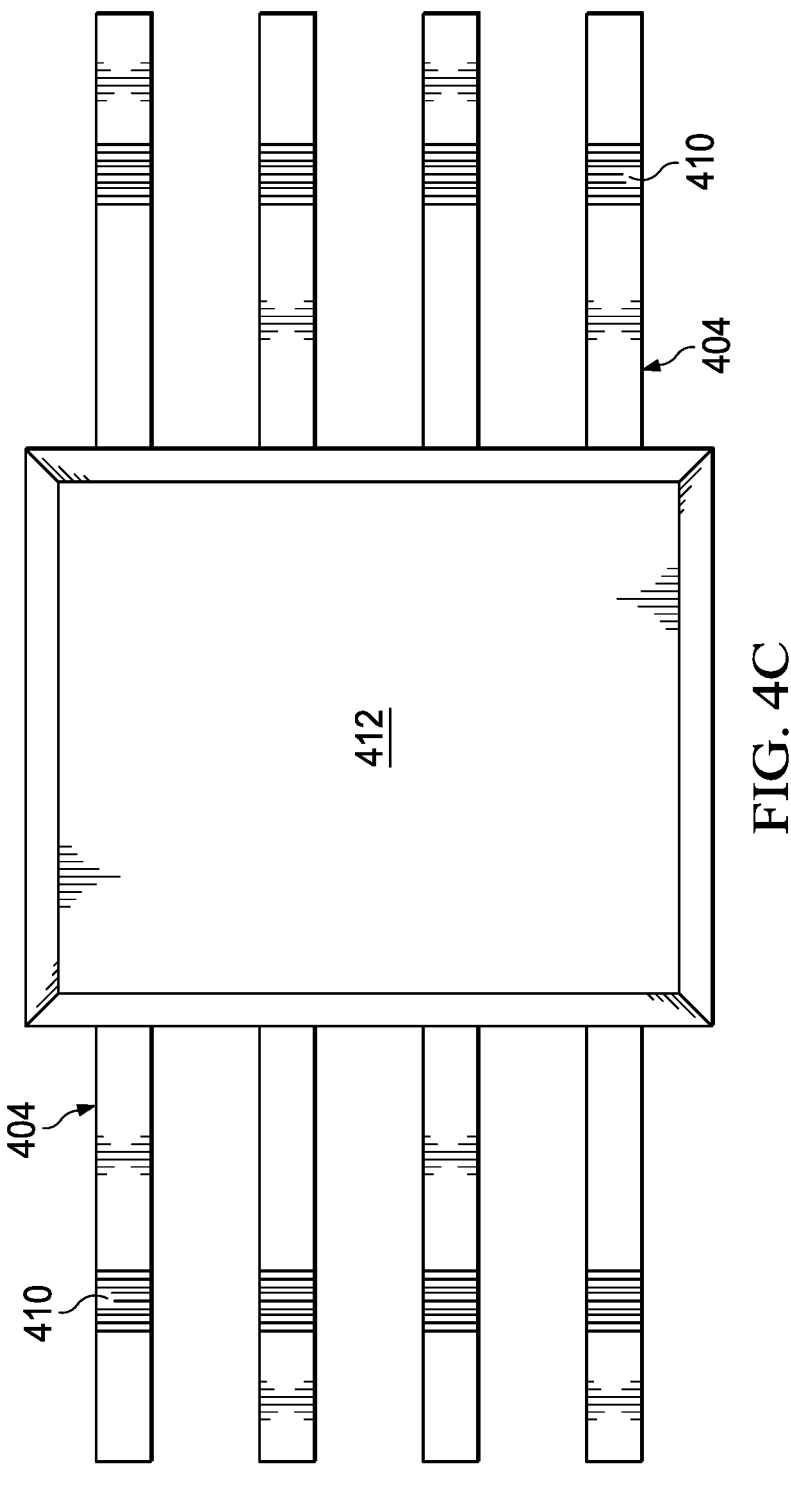

The method 300 includes trimming the lead frame (306). FIG. 4C shows the conductive terminals 404 have been trimmed apart from the remainder of the lead frame 400, such that the conductive terminals 404 are separated from the lead frame 400.

Figure 4D:
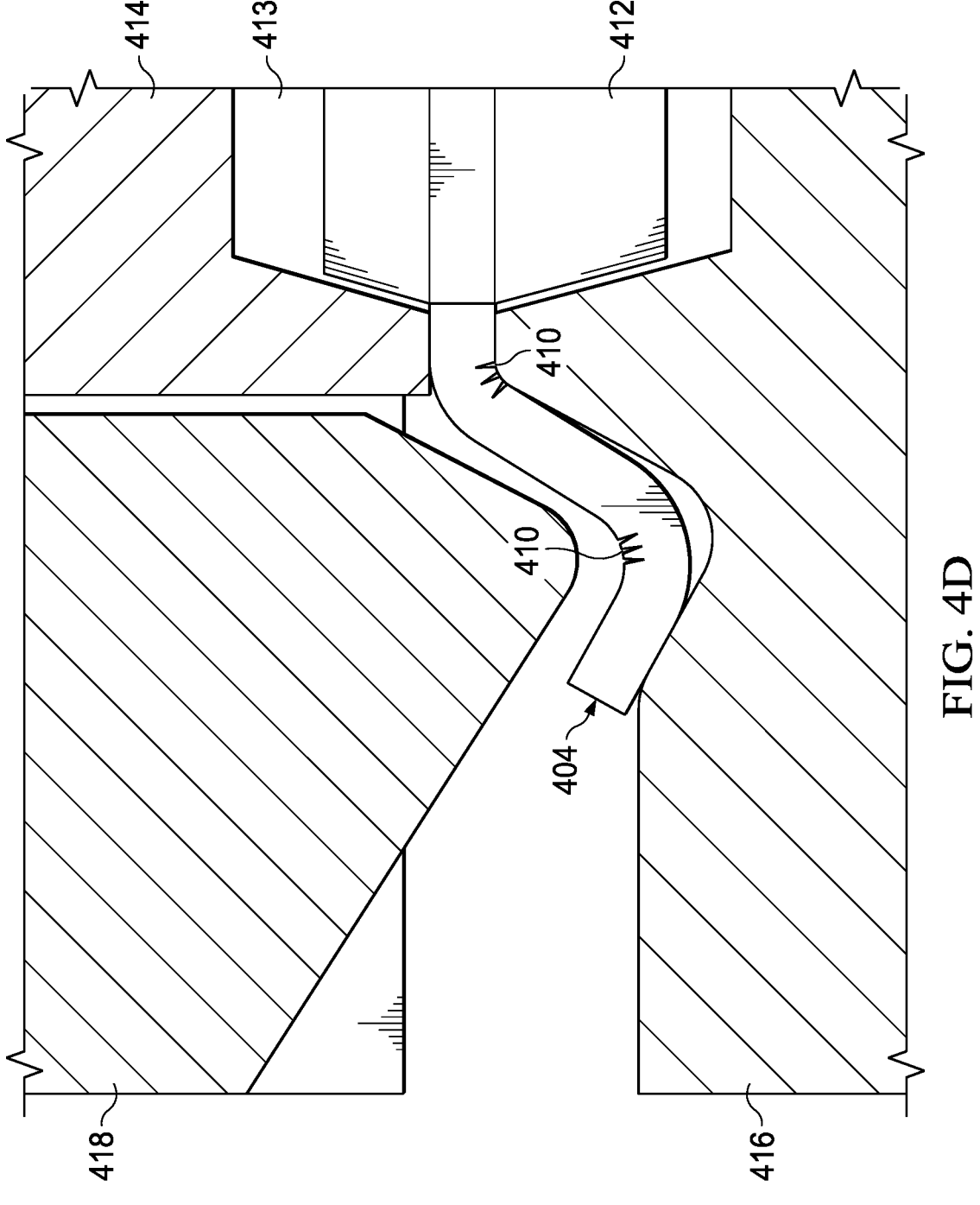

The method 300 includes bending the conductive terminal at the first cavity to form a first bend (308) and bending the conductive terminal at the second cavity to form a second bend (310). FIG. 4D shows a profile view of the package body mold compound 412 in a chamber 413. The conductive terminals 404 are positioned between a stripper 414 and form anvil 416 at a point most proximal to the mold compound 412. A form anvil 418 applies pressure to the conductive terminals 404 to cause the bends at the cavities 410 to form, as shown.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A package, comprising:
a semiconductor die;
a gullwing conductive terminal coupled to the semiconductor die; and
a mold compound covering the semiconductor die and the conductive terminal, the conductive terminal extending outward from the mold compound,
wherein the conductive terminal includes a top surface and a bottom surface opposing the top surface, the conductive terminal including a first bend and a second bend more distal from the mold compound than the first bend, the bottom surface including a first cavity extending along a width of the conductive terminal at the first bend, the top surface including a second cavity extending along the width of the conductive terminal at the second bend.

2. The package of claim 1, wherein the first cavity has first and second widths, the first width more proximal to the bottom surface than the second width, the first width greater than the second width.

3. The package of claim 1, wherein the first cavity is located at least 0.08 mm from a point at which the conductive terminal emerges from the mold compound as measured along a length of the bottom surface of the conductive terminal.

4. The package of claim 1, wherein a depth of the first cavity is at least one-fourth of a thickness of the conductive terminal.

5. The package of claim 1, wherein the conductive terminal includes multiple cavities, including the first cavity, at the first bend and wherein the conductive terminal includes multiple additional cavities, including the second cavity, at the second bend.

6. The package of claim 1, wherein the first bend includes a concavity and wherein the first cavity is positioned in the concavity.

7. The package of claim 1, wherein a foot angle of the conductive terminal ranges from 0 degrees to 8 degrees.

8. A package, comprising:
a semiconductor die;
a gullwing conductive terminal coupled to the semiconductor die; and
a mold compound covering the semiconductor die and the conductive terminal, the conductive terminal extending outward from the mold compound,
wherein the conductive terminal includes a bend forming a concave surface, the conductive terminal including a cavity in the concave surface that spans a width of the conductive terminal, wherein a depth of the cavity is at least 25% of a thickness of the conductive terminal, and wherein the cavity is widest at the concave surface and narrowest at a point most distal from the concave surface.

9. The package of claim 8, wherein the cavity is at least 0.08 mm from a point at which the conductive terminal emerges from the mold compound as measured along a bottom surface of the conductive terminal.

10. The package of claim 8, wherein the conductive terminal includes multiple cavities, including the cavity, at the bend.

11. The package of claim 8, wherein a foot angle of the conductive terminal ranges from 0 degrees to 8 degrees.

12. A package, comprising:
a semiconductor die;
a gullwing conductive terminal coupled to the semiconductor die; and
a mold compound covering the semiconductor die and the conductive terminal, the conductive terminal extending outward from the mold compound,
wherein the conductive terminal includes a bend forming a concave surface, the conductive terminal including multiple cavities in the concave surface that span a width of the conductive terminal, wherein each of the multiple cavities has a tapering width that is widest at the concave surface, and wherein a cavity among the multiple cavities that is most proximal to the mold compound is positioned at least 0.08 mm from a point at which the conductive terminal emerges from the mold compound as measured along a length of a bottom surface of the conductive terminal.

13. The package of claim 12, wherein a cavity in the multiple cavities has a depth that is at least 25% of a thickness of the conductive terminal.

14. The package of claim 12, wherein the conductive terminal has a foot angle ranging from 0 degrees to 8 degrees.

15. A method for manufacturing a package, comprising:
coupling a semiconductor die to a lead frame, the lead frame including a conductive terminal having top and bottom surfaces, the bottom surface including a first cavity spanning a width of the conductive terminal, the top surface including a second cavity spanning the width of the conductive terminal, the first cavity more proximal to the semiconductor die than the second cavity, the first cavity having a tapering width that is widest at the bottom surface and the second cavity having a tapering width that is widest at the top surface, the first and second cavities having depths that are at least one-quarter of a thickness of the conductive terminal;
covering the semiconductor die and a portion of the conductive terminal with a mold compound;
trimming the lead frame;
bending the conductive terminal at the first cavity to form a first bend; and
bending the conductive terminal at the second cavity to form a second bend.

16. The method of claim 15, wherein the first cavity is at least 0.08 mm from a point at which the conductive terminal emerges from the mold compound, as measured along the bottom surface.

17. The method of claim 15, wherein the conductive terminal has a foot angle ranging from 0 degrees to 8 degrees.

18. The method of claim 15, wherein the first cavity is located in a concavity of the conductive terminal.

* * * * *